United States Patent
Haag et al.

(10) Patent No.: US 9,897,145 B2
(45) Date of Patent: Feb. 20, 2018

(54) COATED COMPONENT

(71) Applicant: Schaeffler Technologies AG & Co. KG, Herzogenaurach (DE)

(72) Inventors: Bertram Haag, Uhlfeld (DE); Yashar Musayev, Nuremberg (DE); Walter Holweger, Epfendorf (DE); Toni Blass, Bergrheinfeld (DE); Tim Matthias Hosenfeldt, Nuremberg (DE); Arbogast Grunau, Weisendorf (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 101 days.

(21) Appl. No.: 14/890,525

(22) PCT Filed: Apr. 23, 2014

(86) PCT No.: PCT/DE2014/200177
§ 371 (c)(1),
(2) Date: Nov. 11, 2015

(87) PCT Pub. No.: WO2014/190984
PCT Pub. Date: Dec. 4, 2014

(65) Prior Publication Data
US 2016/0115997 A1    Apr. 28, 2016

(30) Foreign Application Priority Data

May 28, 2013   (DE) .......................... 10 2013 209 863

(51) Int. Cl.
*C23C 14/16*   (2006.01)
*F16C 33/62*   (2006.01)
*C23C 14/58*   (2006.01)
*F16C 33/64*   (2006.01)

(52) U.S. Cl.
CPC ............ *F16C 33/62* (2013.01); *C23C 14/165* (2013.01); *C23C 14/5806* (2013.01); *C23C 14/586* (2013.01); *C23C 14/5853* (2013.01); *F16C 33/64* (2013.01); *F16C 2202/04* (2013.01);
(Continued)

(58) Field of Classification Search
USPC ......... 384/492; 428/336, 698, 701; 204/192, 204/192.15, 192.16
See application file for complete search history.

(56) References Cited

U.S. PATENT DOCUMENTS 3,634,147 A    1/1972   Helwig et al.
5,582,414 A *  12/1996  Miyazaki ............ C23C 14/0641
                                                    428/472
5,700,094 A    12/1997  Dam et al.
(Continued)

FOREIGN PATENT DOCUMENTS

DE         19702852       7/1997
DE        102004043550    3/2006
(Continued)

*Primary Examiner* — Archene Turner
(74) *Attorney, Agent, or Firm* — Volpe and Koenig, P.C.

(57) ABSTRACT

A coated component, in particular to a rolling bearing part, made from a metallic substrate (2), and a PVD coating (3), which is applied to the substrate (2), formed of chromium and having a thickness of less than 2 μm, wherein the PVD coating (3) forms the surface of the component, and a compound of chromium and at least one further element is formed on the component surface.

13 Claims, 1 Drawing Sheet

(52) U.S. Cl.
CPC ...... *F16C 2223/60* (2013.01); *F16C 2360/31* (2013.01)

(56) References Cited

U.S. PATENT DOCUMENTS

| | | | | |
|---|---|---|---|---|
| 6,235,415 | B1* | 5/2001 | Ogawa | C23C 28/04 428/698 |
| 6,598,720 | B2* | 7/2003 | Ritter | F01P 7/046 384/492 |
| 6,631,907 | B1* | 10/2003 | Onoda | F16J 9/26 277/443 |
| 6,764,219 | B2* | 7/2004 | Doll | C23C 14/027 384/492 |
| 7,246,586 | B2 | 6/2007 | Hosenfeldt et al. | |
| 8,337,687 | B2 | 12/2012 | Linde et al. | |
| 2002/0064605 | A1 | 5/2002 | Hatakenaka et al. | |
| 2005/0141797 | A1* | 6/2005 | Kinno | C23C 14/0605 384/492 |
| 2009/0324937 | A1* | 12/2009 | Lev | C23C 14/025 428/336 |
| 2012/0126488 | A1* | 5/2012 | Avelar Ara jo | C23C 14/0641 277/443 |
| 2012/0244382 | A1* | 9/2012 | Chang | C23C 14/0676 204/192.15 |

FOREIGN PATENT DOCUMENTS

| | | |
|---|---|---|
| DE | 102006029415 | 1/2008 |
| DE | 102008017270 | 6/2009 |
| DE | 102009023818 | 12/2010 |
| DE | 102009045889 | 4/2011 |
| WO | 2009065515 | 5/2009 |

\* cited by examiner

COATED COMPONENT

FIELD OF THE INVENTION

The invention relates to a coated component made from steel, in particular, a rolling bearing component, wherein the coating has chromium. The invention further relates to a method for producing such a coating on a metallic substrate.

BACKGROUND

A coated rolling bearing component is known, for example, from DE 10 2009 023 818 A1. In this case, a nickel alloy is provided as a coating, which is generated by a chemical deposition process and has a thickness of approximately 2 µm.

From DE 10 2008 017 270 B3, a structured chromium solid particle layer with a network of cracks is known in which solid particles are embedded. The layer is produced electrolytically and is intended for piston rings.

A multi-layer, electrolytically deposited chromium layer is known, for example, from DE 10 2009 045 889 A1. The thickness of individual layers is here a maximum of, for example, 7 µm, in particular a maximum of 3 µm. In addition to chromium, the layers could contain foreign ions, such as carbide, molybdenum, vanadium, or tungsten ions. The possibility of generating protective layers through physical gas phase deposition (PVD) is also mentioned in DE 10 2009 045 889 A1. However, this manufacturing method is not to be recommended for the production of wear protective layers due to the fact that it is considered for use only for thin layers in the range of a few nanometers up to a few micrometers due to economic reasons.

Wear protective layers that can be deposited in a PVD (physical vapor deposition) process can be built essentially from carbon and are also called DLC (diamond like carbon) layers. One example of such a coating is disclosed in DE 10 2006 029 415 A1. Between the carbon layer and the substrate there can be a support layer that contains, for example, chromium.

SUMMARY

The invention is based on the objective of improving a coating of a metallic component, for example, of a rolling bearing component, in particular with respect to the properties that are relevant for interacting with lubricants.

This objective is achieved by a coated component and by a method for producing a coating with one or more features of the invention. Consequently, constructions and advantages of the invention explained in connection with the component apply analogously also for the production process and vice versa.

The coated component has a metallic substrate and a coating made from chromium deposited on this substrate in a PVD process with a thickness of less than 2 µm. No additional coating is deposited on the chromium layer. However, on the component surface, that is, on the surface of the chromium layer, a compound made from chromium and at least one other element is formed. This compound is generated either in the scope of the production process of the component or only after the component is put into operation due to the prevailing operating conditions, in particular, loading with lubricant. The thickness of the chromium layer is practically not increased by the compound with the additional element.

The invention starts from the idea that lubricants in rolling bearing technology can have both positive and negative effects on the service life of a bearing. Negative effects are conceivable, in particular, through decomposition products or aging products of lubricants.

In damage-causing mechanisms to the surface of metallic components, hydrogen can play a role. Atomic hydrogen is embedded in the metal layer as a function of the processing conditions during galvanic deposition of a metal layer, wherein diffusion of hydrogen into the substrate is also possible. In addition, during the running operation of the component, effects due to nascent hydrogen are also conceivable.

In rolling bearing technology, damage-causing mechanisms due to hydrogen are associated with so-called white etching cracks (WEC) or white etching areas (WEA). This subject is discussed, for example, in the document WO 2009/065515 A2.

While the resistance of a metallic coating, in particular, chromium coating, is to be optimized according to the mentioned prior art by increasing the layer thickness, by a multi-layer structure, or by embedding additional coating components, according to the invention the layer thickness is restricted to very low values of a maximum of 2 µm, preferably less than 1 µm, especially preferred less than 500 nm, wherein the layer is not generated by wet chemistry, but is instead deposited from the gas phase.

The chromium layer deposited from the gas phase is also called simply PVD layer in the present case, which distinguishes it from a layer deposited from an aqueous phase. The term "PVD coating" also includes layers that are produced according to a CVD (chemical vapor deposition) process, PA-CVD (physical assisted chemical vapor deposition) process, or MO-CVD (metal organic chemical vapor deposition) process. In all of these cases, this coating has the advantage that it forms a crack-free barrier against environmental effects, especially against hydrogen. Surprisingly, it has been shown that the small layer thickness of less than 2 µm provides a sufficient protective effect even under extreme environmental conditions.

On the coating surface, the chromium can form chromium oxide in interaction with oxygen from the outside. The chromium oxide created as a boundary layer forms an integral part of the coating of the component, wherein this boundary layer can grow during the course of operation of the component and wherein the entire coating is also called chromium layer.

According to one advantageous process control, at the end of the coating process that takes place in a coating chamber, the coating chamber is supplied with air at a temperature between 130° C. and 160° C., in particular, at a temperature of approx. 150° C., in order to form chromium oxide in a targeted way on the surface of the already produced chromium layer. Supplying air in this context also means adding a synthetic, oxygen-containing gas mixture or pure oxygen. In each case, the addition of oxygen in the specified temperature range provides for the creation of an extremely thick and dense oxide layer at the end of the coating process, wherein this oxide layer suppresses any disadvantageous interaction with damaging elements or compounds from a lubricant while the component coated in this way, in particular, a bearing component, is in operation.

Instead of oxygen, nitrogen could also form a compound, as the additional element, with the chromium layer, wherein, in this case, chromium nitride is formed as an especially resistant barrier to environmental effects.

The chromium nitride is deposited in the scope of forming the PVD coating designated overall as chromium layer, for example, by a reactive PVD sputtering process. Preferably, the chromium nitride in the coating exists in nanocrystalline form of different CrNx phases. The portion of $Cr_2N$ bonds is here advantageously greater than 70%. Additional advantageous features of $CrN_x$ phases, like those that can be produced on the surface of the PVD coating, are disclosed, for example, in DE 10 2004 043 550 B4.

In a preferred construction, the hardness of the coating made from chromium and at least one compound that contains at least one additional element in addition to chromium is between 800 and 1200 HV 0.3. The coating is advantageously at least 100 nm thick.

The process for producing a coating comprises the following features, independent of the technical field of application:
- A workpiece, in particular, rolling bearing part, is produced from a metallic substrate,
- On the substrate, a chromium layer with a thickness of at least 2 µm is deposited that forms the workpiece surface and is not additionally coated.

The chromium layer is generated directly on the substrate without an intermediate layer and can be run over—in the field of the application by rolling bearings. The workpiece can be, for example, a bearing ring or a rolling body of a bearing of a wind turbine.

One special advantage of the process according to the invention lies in the fact that, in addition to the outstanding protective properties of the coating, the dimensions of the workpiece are changed only to an extremely minimal degree due to the coating process. The coating is deposited, for example, by sputtering. In contrast to electrochemical coating processes, this also has the advantage that, in addition to freedom of cracks in the layer, the layer thickness at different areas of the surface of the workpiece is only minimally dependent on the workpiece geometry, for example, edges.

An embodiment of the invention is explained in more detail below with reference to the drawings. Shown, in schematic sectional views each in section, are:

DETAILED DESCRIPTION OF THE PREFERRED EMBODIMENTS

Figure 1:
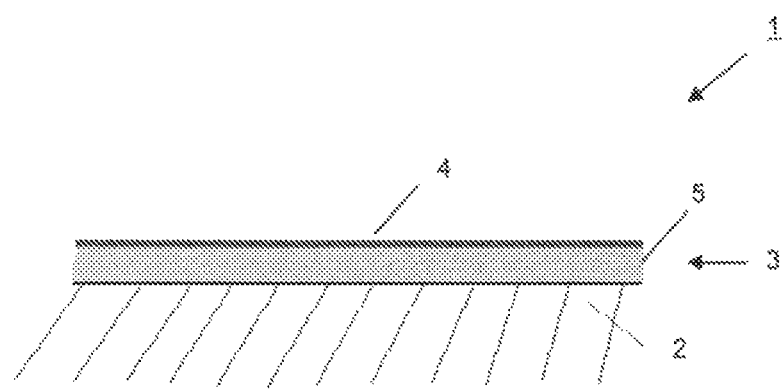
FIG. 1 a component coated according to the invention with chromium in a PVD process, and FIG. 2 for comparison, a component with a galvanically generated chromium layer.

A component marked in FIG. 1 overall with the reference symbol 1, namely rolling bearing component, for example, an inner ring, an outer ring, or a rolling body, is made from a metallic base material, also called substrate 2, on which a coating 3 is deposited.

The coating 3 is made for the large part from chromium and is generated in a PVD process. The initial coating 3 present immediately after production as a layer made from pure chromium forms a chromium oxide layer 4 with oxygen from the environment on its surface that is simultaneously also the workpiece surface, wherein this chromium oxide layer is to be distinguished from an underlying chromium layer 5 directly adjacent to the substrate, namely rolling bearing steel, for example, 100Cr6 or M50NIL. The thickness of the chromium oxide layer 4 in relation to the total thickness of the coating 3 is not shown to scale in FIG. 1. The total thickness of the coating 3 is 1 to 2 µm. This applies to flat surface sections of the component 1 and also to curved surface sections, also with tight radii of curvature of, for example, significantly less than 1 mm. The coating 3 has neither voids nor raised sections, for example, in the form of so-called droplets.

With respect to damaging environmental influences, especially hydrogen, the chromium oxide layer 4 is an impermeable barrier. Its protective effect is maintained even for minimal damage to the coating 3 not extending to the substrate, because a new chromium oxide layer 4 forms on the component 1 as a diffusion barrier. In addition to its function as a barrier layer, the effect of the coating 3 is also given by catalytic effect.

The protective effect of the coating 3 is traced back not only to the chromium oxide layer 4, but also to the fact that, due to the production of the coating 3 by deposition from the gas phase in contrast to galvanically generated layers, no hydrogen is embedded into the coating 3. Thus it is ruled out in advance that any hydrogen atoms located in the coating will diffuse into the component 1.

Figure 2:
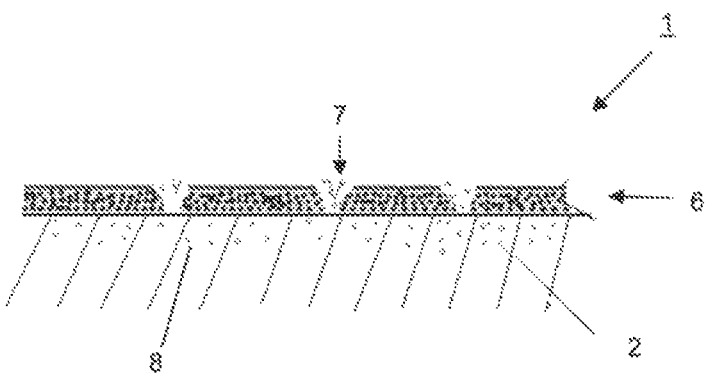

The structure of a conventional, electrochemical wear protective layer 6 is shown in FIG. 2 in a view analogous to that of FIG. 1. In contrast to the coating 3 according to FIG. 1, the wear protective layer 6 has cracks 7. At least one portion of these cracks 7 extends to the base material 2 (substrate). In the breaks of the wear protective layer 6 formed by the cracks 7, environmental effects, especially in the form of hydrogen 8, can attack the substrate 2 of the component 1 unimpeded. There is no mechanism to stop such effects. In addition to the hydrogen 8 acting from the outside, drawn in FIG. 8 in the form of dots, a significant, harmful quantity of hydrogen 8 exists within the wear protective layer 6. This hydrogen 8 diffuses into the substrate 2 during the course of time and its damaging effects develop there, which can ultimately lead to WEC, together with other effects, especially mechanical loading.

Such a damage mechanism is reliably prevented with the coating according to FIG. 1. Simultaneously, the coating 3 consisting primarily of chromium on the component 1 according to FIG. 1 can carry high mechanical loads and is connected permanently to the substrate 2 with no risk of flaking. The hardness of the coating 3 is 800 to 1200 HV 0.05. With the deposition of the coating 3 in the PVD process, the component 1 is not exposed to relevant thermal loads, for example, due to exceeding the tempering temperature of the substrate 2. The coating 3 is neither coated with an additional protective layer nor mechanically post-processed during the course of the production process.

LIST OF REFERENCE NUMBERS

1 Component
2 Substrate, base material
3 Coating
4 Chromium oxide layer
5 Chromium layer
6 Sealing protective layer
7 Crack
8 Hydrogen

The invention claimed is:
1. A coated component, comprising
   a metallic substrate,
   a PVD coating made from chromium and deposited on the substrate with a thickness of less than 500 nm and greater than 100 nm, wherein the PVD coating forms a surface of the component and a barrier made from a compound of chromium and at least one additional element is formed on said component surface, and the at least one additional element is oxygen or nitrogen or both, wherein the component is a rolling bearing part.

2. A component according to claim 1, wherein the metallic substrate is formed of rolling bearing steel.

3. The component according to claim 1, wherein the metallic substrate is formed of 100 Cr6 or M50NiL.

4. The component according to claim 1, wherein the hardness of the PVD coating is at least 800 HV 0.05.

5. The component according to claim 1, wherein the hardness of the PVD coating is at most 1200 HV 0.05.

6. The component according to claim 1, wherein the nitrogen forms the barrier from chromium nitride with the chromium of a chromium layer.

7. The component according to claim 6, wherein the chromium nitride is present in nanocrystaline form and a portion of $Cr_2N$ phase is >70%.

8. A rolling bearing comprising a component according to claim 1 as at least one of a bearing ring or a rolling body.

9. A process for producing a coated component comprising the following steps:
providing a rolling bearing component formed of a metallic substrate,
depositing a PVD coating as a chromium layer with a thickness of less than 500 nm and greater than 100 nm on the substrate in a PVD process while forming a component surface, and
forming a barrier made form a chromium compound of the chromium layer and at least one additional element on the component surface, with the at least one additional element comprising oxygen or nitrogen or both.

10. The process according to claim 9, wherein the deposition of the chromium layer takes place through sputtering.

11. The process according to claim 10, wherein a barrier made from chromium nitride is formed on the component surface through reactive sputtering with nitrogen in connection with the chromium of the chromium layer.

12. The process according to claim 9, wherein a barrier made from chromium oxide is formed on the component surface by supplying air to a coating chamber used for forming the chromium layer at a temperature between 130° C. and 160° C.

13. A rolling bearing, comprising
a coated component including:
a metallic substrate,
a PVD coating made from chromium and deposited on the substrate with a thickness of less than 500 nm and greater than 100 nm,
wherein the PVD coating forms a surface of the component and a barrier made from a compound of chromium and at least one additional element is formed on said component surface, wherein the at least one additional element is oxygen or nitrogen or both, and
a combined thickness of the PVD coating and the barrier is less than 500 nm and greater than 100 nm.

* * * * *